(12) United States Patent
Tabuchi et al.

(10) Patent No.: US 9,013,151 B2
(45) Date of Patent: Apr. 21, 2015

(54) STATE-OF-CHARGE ESTIMATION APPARATUS

(75) Inventors: Akiko Tabuchi, Tokyo (JP); Shoji Yoshioka, Tokyo (JP); Keita Hatanaka, Tokyo (JP); Hidetoshi Kitanaka, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 408 days.

(21) Appl. No.: 13/580,625

(22) PCT Filed: Mar. 26, 2010

(86) PCT No.: PCT/JP2010/055457
§ 371 (c)(1),
(2), (4) Date: Aug. 22, 2012

(87) PCT Pub. No.: WO2011/118039
PCT Pub. Date: Sep. 29, 2011

(65) Prior Publication Data
US 2012/0326726 A1    Dec. 27, 2012

(51) Int. Cl.
*G01N 27/416* (2006.01)
*G01R 31/36* (2006.01)
(Continued)

(52) U.S. Cl.
CPC ......... *G01R 31/3648* (2013.01); *H01M 10/441* (2013.01); *H01M 10/482* (2013.01);
(Continued)

(58) Field of Classification Search
CPC .............. G01R 31/361; Y02T 10/7005; B06L 2240/80
USPC .......................................... 320/132; 324/434
See application file for complete search history.

(56) References Cited

U.S. PATENT DOCUMENTS

| 7,355,411 B2 * | 4/2008 | Murakami et al. ............ 324/427 |
| 8,040,108 B2 * | 10/2011 | Tomura et al. ................ 320/132 |
| 2005/0073315 A1 * | 4/2005 | Murakami et al. ............ 324/433 |

FOREIGN PATENT DOCUMENTS

| JP | 7-123514 A | 5/1995 |
| JP | 8-029505 A | 2/1996 |

(Continued)

OTHER PUBLICATIONS

International Search Report (PCT/ISA/210) issued on Jun. 29, 2010, by the Japanese Patent Office as the International Searching Authority for International Application No. PCT/JP2010/055457.
(Continued)

*Primary Examiner* — Sun Lin
(74) *Attorney, Agent, or Firm* — Buchanan Ingersoll & Rooney PC

(57) ABSTRACT

A state-of-charge estimation apparatus connected to a power storage device having cell batteries, and estimating a state of charge of the power storage device, the apparatus including a first SOC computation unit computing a current integration value based on a total current from a current detector detecting the total current flowing to the storage device from a power conversion device using a previous SOC value as an initial value, and outputting the integration value as a first state-of-charge estimated value, and a second SOC computation unit estimating, after discharge suspension in the storage device, an open-circuit voltage based on a total voltage on a connection point between the conversion device and the storage device, a previous value of the total voltage, and a gain with time passage after discharge suspension in the storage device, and outputting the open-circuit voltage as a second state-of-charge estimated value.

10 Claims, 7 Drawing Sheets

(51) Int. Cl.
  *H01M 10/44* (2006.01)
  *H01M 10/48* (2006.01)
  *H02J 7/00* (2006.01)

(52) U.S. Cl.
  CPC ............ *H02J7/0021* (2013.01); *Y02T 10/7055* (2013.01); *G01R 31/361* (2013.01); *G01R 31/3624* (2013.01)

(56) References Cited

FOREIGN PATENT DOCUMENTS

| JP | 2005-345254 A | 12/2005 |
|---|---|---|
| JP | 2006-105821 A | 4/2006 |
| JP | 2007-024687 A | 2/2007 |
| JP | 2007-333474 A | 12/2007 |
| JP | 2008-199723 A | 8/2008 |

OTHER PUBLICATIONS

Written Opinion (PCT/ISA/237) issued on Jun. 29, 2010, by the Japanese Patent Office as the International Searching Authority for International Application No. PCT/JP2010/055457.

Japanese Office Action issued on Feb. 15, 2011, with English language translation, 3 pages.

* cited by examiner

STATE-OF-CHARGE ESTIMATION APPARATUS

FIELD

The present invention relates to an apparatus that estimates a state of charge (SOC) of a secondary battery.

BACKGROUND

Generally, when batteries are used in a railway system in order to supply energy during running or to recover regenerative energy at the time of deceleration and halt, many cell batteries are used with being connected to each other in series-parallel combination, because of a large amount of electric energy to be consumed. At this point, it is necessary to obtain an SOC for the running of a vehicle and control of charge/discharge of batteries.

There has been conventionally known a method of estimating an SOC of a battery by a combination of a system using integration of charge and discharge currents and a system using a relation between an open-circuit voltage and the SOC of a secondary battery held in equilibrium (for example, Patent Literature 1 mentioned below). The method disclosed in Patent Literature 1 is to estimate an SOC from current integration at the time of charge or discharge, and to estimate an SOC by estimating the open-circuit voltage during a standby time.

In relation to the open-circuit voltage estimation method, there has been known an example of estimating an open-circuit voltage using a voltage change after charge or discharge (for example, Patent Literature 2 mentioned below).

CITATION LIST

Patent Literatures

Patent Literature 1: Japanese Patent Application Laid-open No. 2008-199723
Patent Literature 2: Japanese Patent Application Laid-open No. 2007-333474

SUMMARY

Technical Problem

However, the method of Patent Literature 1 mentioned above has the following problems. That is, because an equivalent circuit of a battery is used to estimate an open-circuit voltage, an internal resistance dependent on a temperature or an SOC is required, and it is also required to take battery degradation into consideration.

Meanwhile, when an SOC of a power storage device composed of many batteries is estimated, it is desirable to measure a battery voltage and a battery current for the entire batteries that constitute the power storage device. However, sensors for measuring the battery voltage and the battery current are not high in resolution and accuracy, so that the measurement values often include ripples. According to Patent Literature 2 mentioned above, the open-circuit voltage is estimated by measuring a total voltage of the batteries and making addition of a predetermined value when the change rate of the total voltage is equal to or lower than a predetermined value after charge or discharge. Therefore, it is possible to estimate the open-circuit voltage only by measuring the total voltage without using any equivalent circuit constants. However, there are problems in that it is required to ensure a high voltage-measuring accuracy to obtain a stable value because a significant difference is caused in the SOC when the open-circuit voltage of cells differs only by 1 mV.

The present invention has been achieved in view of the above-mentioned circumstances, and an object of the present invention is to provide a state-of-charge estimation apparatus that can suppress change in an SOC estimated value.

Solution to Problem

In order to solve the above-mentioned problems and achieve the object, the present invention provides a state-of-charge estimation apparatus that is connected to a power storage device constituted by connecting a plurality of cell batteries, and estimates a state of charge of the power storage device, the state-of-charge estimation apparatus comprising: a first computation unit that computes a current integration value based on a current from a detector that detects a current flowing to or from the power storage device from or to a power conversion unit while a previous value of a state-of-charge estimated value is set as an initial value, and that outputs the computed current integration value as a first state-of-charge estimated value; a second computation unit that estimates, after suspension of charge or discharge in the power storage device, an open-circuit voltage based on a voltage detected in a connection point between the power conversion unit and the power storage device, a previous value of the voltage detected in the connection point, and a gain that decreases with passage of time after the suspension of the charge or discharge in the power storage device, and that outputs the estimated open-circuit voltage as a second state-of-charge estimated value; and a selection unit that selects any one of the first state-of-charge estimated value and the second state-of-charge estimated value.

Advantageous Effects of Invention

According to the present invention, the state-of-charge estimation apparatus includes a first SOC computation unit that estimates a first state-of-charge estimated value, a second SOC computation unit that estimates a second state-of-charge estimated value, and an SOC sudden-change prevention unit that suppress sudden change in the second state-of-charge estimated value based on a variable gain and a previous SOC value. Therefore, it is possible to suppress the change in the SOC estimated value even when the battery-voltage measurement accuracy is low or the measured voltage has ripples.

DESCRIPTION OF EMBODIMENTS

Embodiments of a state-of-charge estimation apparatus according to the present invention will be described below in detail with reference to the drawings. The present invention is not limited to the embodiments.

First Embodiment

Figure 1:
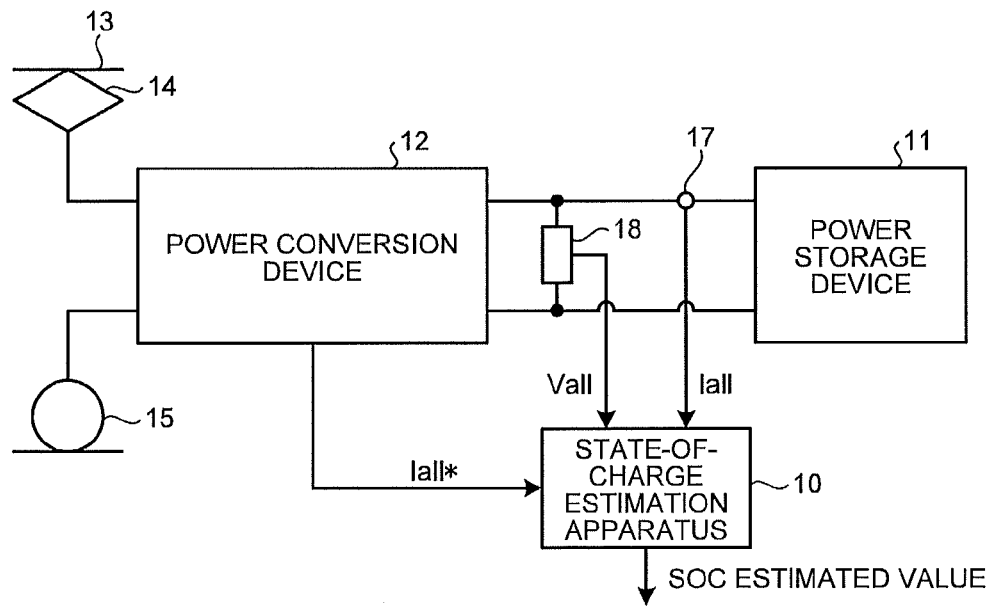
FIG. 1 is a diagram showing a configuration of an electric rolling stock to which a state-of-charge estimation apparatus according to the present invention is applied.
Figure 2:
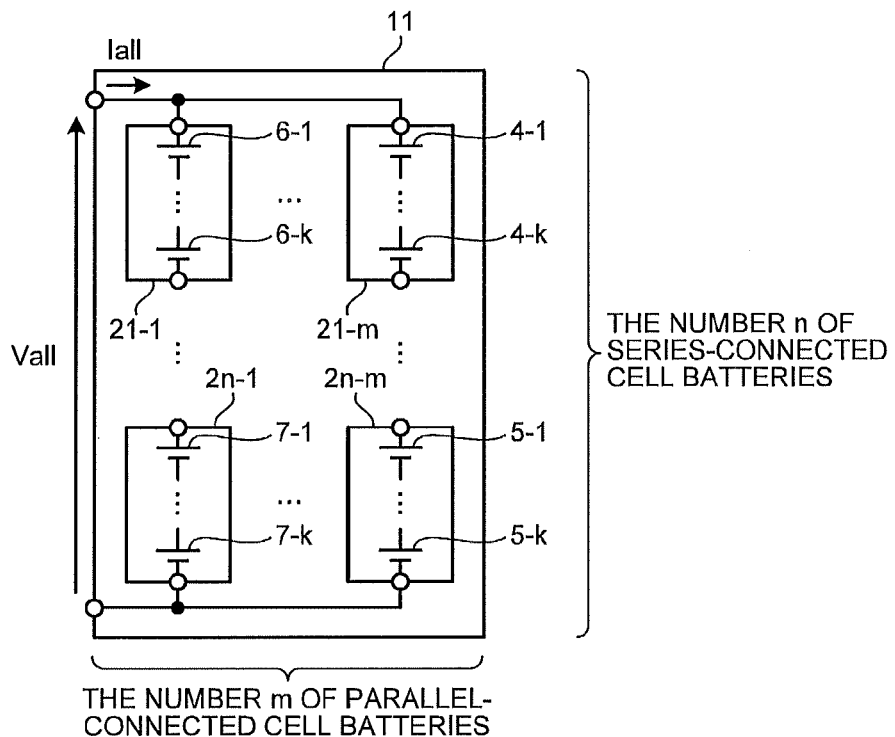
FIG. 2 is a diagram showing configuration of a power storage device shown in FIG. 1.
Figure 3:
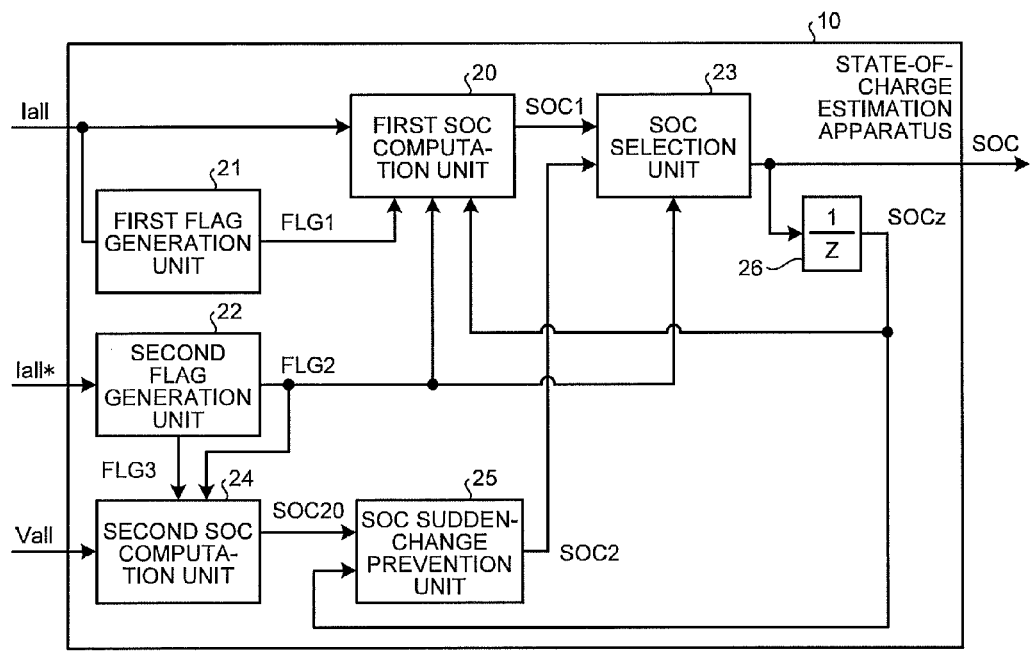
FIG. 3 is a diagram showing a configuration of a state-of-charge estimation apparatus according to a first embodiment of the present invention.

FIG. 1 is a diagram showing a configuration of an electric rolling stock to which a state-of-charge estimation apparatus 10 according to the present invention is applied, FIG. 2 is a diagram showing a configuration of a power storage device 11 shown in FIG. 1, and FIG. 3 is a diagram showing a configuration of the state-of-charge estimation apparatus 10 according to the first embodiment of the present invention.

A power conversion device (power conversion unit) 12 shown in FIG. 1 is connected to a power collector 14 and wheels 15 that serve as a return circuit of a return current, and receives power from an overhead wire 13 connected to an electric power substation (not shown) that serves as a direct-current (DC) power supply. A voltage detector 18 shown in FIG. 1 detects a voltage in a connection point between the power conversion device 12 and the power storage device 11. A current detector 17 detects a current that flows to or from the power storage device 11. The state-of-charge estimation apparatus 10 computes and outputs an SOC estimated value based on a current command Iall* from the power conversion device 12, a total voltage Vall detected by the voltage detector 18, and a total current Iall detected by the current detector 17.

With reference to FIG. 2, the power storage device 11 is configured to include battery modules 21-1 to 2n-m. The battery module 21-1 is constituted by connecting cell batteries 6-1 to 6-k in series. Similarly, the battery module 2n-1 is constituted by connecting cell batteries 7-1 to 7-k in series. The battery module 21-m is constituted by connecting cell batteries 4-1 to 4-k in series. The battery module 2n-m is constituted by connecting cell batteries 5-1 to 5-k in series. Each cell battery is a repeatedly dischargeable/rechargeable secondary battery such as a lithium ion secondary battery, and an SOC of each cell battery can be observed by measuring an open-circuit voltage. A breaker, a battery monitoring device and the like are not shown here although these are often provided in the power storage device 11.

A voltage between terminals of the power storage device 11 is assumed as the total voltage Vall. It is assumed that a discharge/charge current is the total current Iall and that the value of the total current Iall is positive in a charging state. It is also assumed that the number of parallel-connected cells (modules) is m and the number of series-connected cells (modules) is n in the power storage device 11, where n=(the number of modules)×(the number of series-connected cells in each module). Because of the large number of cells that constitute the power storage device 11, a voltage resulting from a resistance component of conductors or cables used for the connecting the terminals is added to the total voltage Vall during charge/discharge.

In FIG. 1, the voltage detector 18 and the current detector 17 provided on an intermediate between the power conversion device 12 and the power storage device 11 are used to measure the total voltage Vall and the total current Iall. However, the total voltage Vall and the total current Iall are not limited to those measured in this manner, and a total voltage Vall and a total current Iall measured by a charge/discharge circuit side (not shown) may be used. In this case, the resistance component of the cable led to the state-of-charge estimation apparatus 10 becomes larger, and therefore it is desirable to consider an attenuation amount caused by this resistance component.

(State-of-Charge Estimation Apparatus 10)

FIG. 3 is a diagram showing a configuration of the state-of-charge estimation apparatus 10 according to the first embodiment of the invention. The state-of-charge estimation apparatus 10 is configured to include, as main constituent elements, a first flag generation unit 21, a second flag generation unit 22, a second SOC computation unit 24, a first SOC computation unit 20, an SOC selection unit 23, an SOC sudden-change prevention unit (change-amount restriction unit) 25, and a unit-delay unit 26.

The first SOC computation unit 20 computes and outputs a first state-of-charge estimated value (hereinafter, simply referred to as "first estimated value") SOC1 based on the total current Iall, a first flag (FLG1) generated by the first flag generation unit 21, and an SOCz that is a previous value of SOC from the unit-delay unit 26 (hereinafter, referred to as "previous value SOCz").

The second SOC computation unit 24 computes and outputs a second state-of-charge estimated value SOC20 based on the total voltage Vall and a second flag (FLG2) and a third flag (FLG3) from the second flag generation unit 22.

The SOC sudden-change prevention unit (hereinafter, simply referred to as "sudden-change prevention unit") 25 outputs a third state-of-charge estimated value (hereinafter, simply referred to as "third estimated value") SOC2 based on the second state-of-charge estimated value (hereinafter, simply referred to as "second estimated value) SOC20 from the second SOC computation unit 24 and the previous value SOCz from the unit delay-unit 26.

The SOC selection unit 23 selects, as the SOC, any one of the first estimated value SOC1 from the first SOC computation unit 20 and the third estimated value SOC2 from the sudden-change prevention unit 25 according to the value of the FLG2 from the second flag generation unit 22.

An overall computation cycle t1 [sec] of the state-of-charge estimation apparatus 10 is 0.1 [sec], for example. As described above, the power storage device 11 is composed of many cells. Generally, series-connected batteries are provided with a battery-voltage equalization unit (not shown), and the parallel-connected series cells have a substantially equal voltage value. Therefore, it is considered that SOC variations among the cell batteries are not remarkable. For this reason, the SOC is handled as a single value.

A configuration of the state-of-charge estimation apparatus 10 is explained below in detail.

(First SOC Computation Unit 20)

Figure 4:
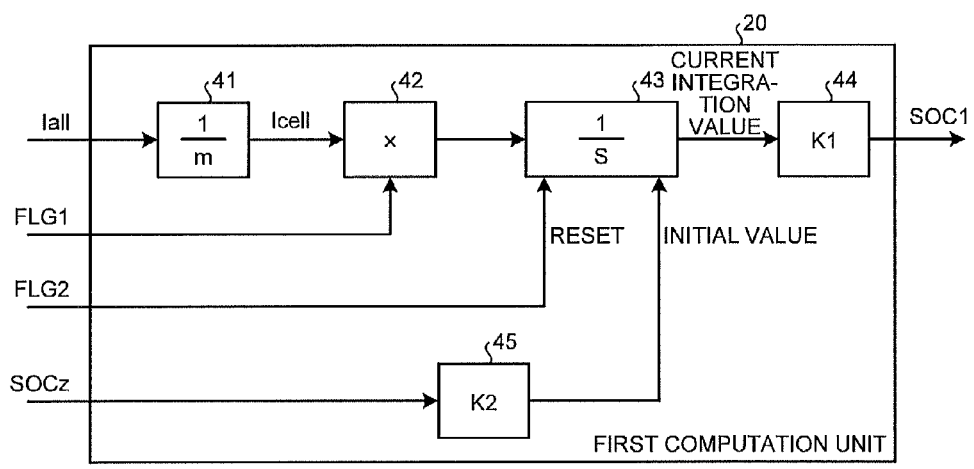
FIG. 4 is a diagram showing a configuration of a first SOC computation unit shown in FIG. 3.
Figure 5:
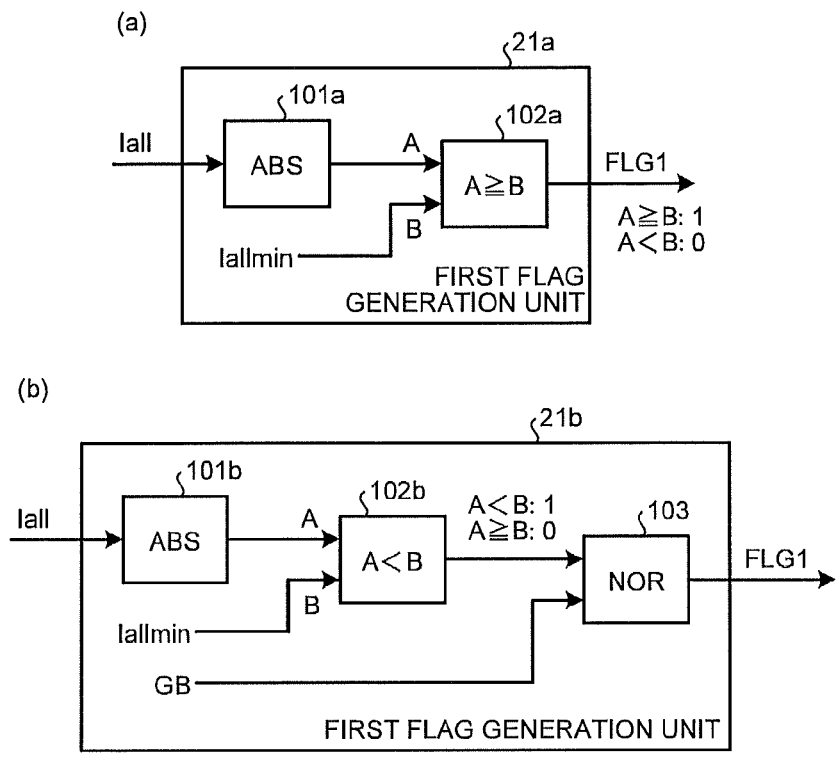
FIG. 5 is a diagram showing a configuration of a first flag generation unit shown in FIG. 3.
Figure 6:
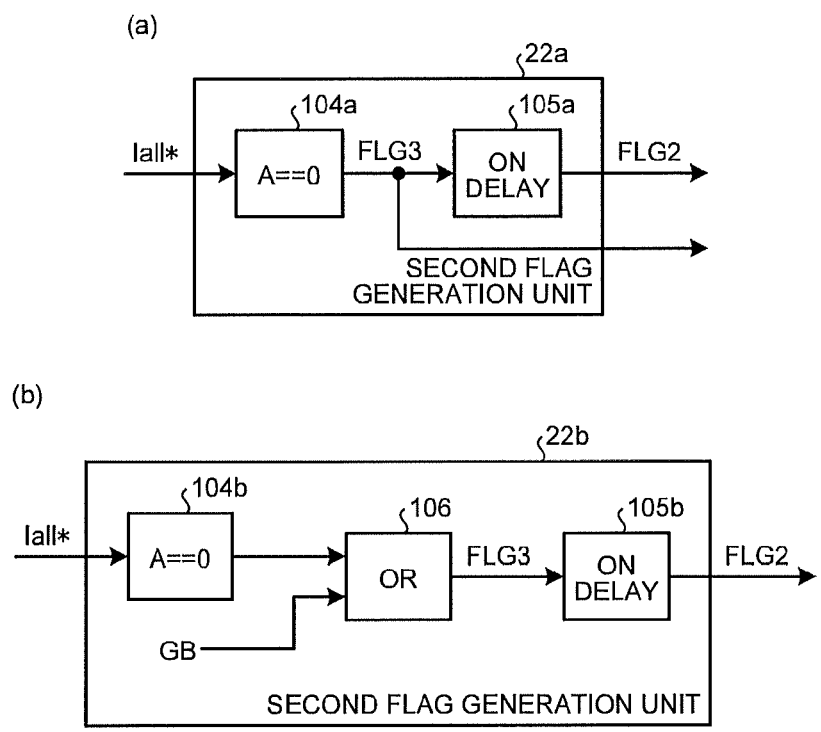
FIG. 6 is a diagram showing a configuration of a second flag generation unit shown in FIG. 3.

FIG. 4 is a diagram showing a configuration of the first SOC computation unit shown in FIG. 3, FIG. 5 is a diagram showing a configuration of the first flag generation unit shown in FIG. 3, and FIG. 6 is a diagram showing a configuration of the second flag generation unit shown in FIG. 3.

In FIG. 4, the first SOC computation unit 20 is configured to include a gain unit 41, a multiplier 42, an integrator 43, a gain unit 44, and a gain unit 45.

The gain unit 41 obtains a cell-current average value Icell by multiplying the total current Iall by a gain 1/m. That is, the gain unit 41 obtains an average value of cell currents by dividing the total current Iall by the number m of parallel-connected cell batteries.

The multiplier 42 multiplies the cell-current average value Icell from the gain unit 41 by the FLG1 and outputs a multiplication result. This multiplier 42 stops integration when the FLG1 is 0 and executes integration when the FLG1 is 1. The FLG1 is generated by the first flag generation unit 21 described later, and the FLG1=1 indicates execution of integration and the FLG1=0 indicates stop of integration.

The integrator 43 integrates an output from the multiplier 42, and the integrator 43 is reset every time in a case where FLG2 is 1.

The gain unit 45 multiplies the previous value SOCz by a gain K2, thereby converting the value SOCz into an initial current-integration value (an initial value). In this way, the initial current-integration value is obtained from the previous value SOCz when the integrator 43 is reset by the FLG2. The gain K2 of the gain unit 45 is K2=battery capacity [Ah]×3600 [sec]/100 [%]. The FLG2 is generated by the second flag generation unit 22 described later.

The gain unit 44 multiplies a current integration value from the integrator 43 by a gain K1, so as to convert the integration value into the first estimated value SOC1. Note that K1=1/battery capacity [Ah]/360 [sec]×100 [%].

The first SOC computation unit 20 is configured to stop integration to prevent an error in the SOC value from increasing due to the influence of a current detection error when the FLG1 is 0. This configuration is described. A case of satisfying a relation of |Iall|<Iallmin indicates the following states. The first of them is a state where the current command Iall*=0 so that charge and discharge is suspended, and only a ripple current flows. The second of them is a state where the current command Iall*=0 is not held but the charge or discharge continues in constant voltage charge at a current value lower than Iallmin. When the current is low, influences of the current detection error is significant. Therefore, the first SOC computation unit 20 is configured so that, when the FLG1 is 0, an output value of the integrator 43 no longer changes and the first estimated value SOC1 becomes a constant value by causing the multiplier 42 to stop integration.

FIG. 5(a) is a diagram showing one configuration example of the first flag generation unit 21 shown in FIG. 3, and FIG. 5(b) is a diagram showing another configuration example of the first flag generation unit 21 shown in FIG. 3.

A first flag generation unit 21a shown in FIG. 5(a) is configured to include an absolute-value computation unit 101a that computes an absolute value of the total current Iall, and a comparator 102a that compares the absolute value from the absolute-value computation unit 101a with the current threshold Iallmin and outputs the comparison result as the FLG1. If the absolute value |Iall| (A) of Iall is equal to or higher than the current threshold Iallmin (B), then FLG1=1. If the absolute value |Iall| (A) of Iall is lower than the current threshold Iallmin (B), then FLG1=0.

A first flag generation unit 21b shown in FIG. 5(b) is configured to include an absolute-value computation unit 101b that computes the absolute value of the total current Iall, a comparator 102b that compares the absolute value from the absolute-value computation unit 101b with the current threshold Iallmin and outputs a comparison result, and a NOR gate 103 that receives the output from the comparator 102b and a gate block GB from the charge/discharge circuit (not shown) as inputs and outputs a logical result of their values as the FLG1. If configuration is made such that FLG1=0 is outputted when the gate block GB from the charge/discharge circuit is detected, a value of the FLG1 can be changed with a higher accuracy than that of the first flag generation unit 21a shown in FIG. 5(a).

FIG. 6 is a diagram showing the configuration of the second flag generation unit 22 shown in FIG. 3.

A second flag generation unit 22a shown in FIG. 6(a) is configured to include a comparator 104a that outputs the FLG3 when the current command Iall* is 0, and an ON delay unit 105a that changes the value of the FLG2 to 1 after passage of a predetermined time t2 [sec] since the FLG3 becomes 1 (FLG3=1) and outputs the FLG2. For example, when the current command Iall* becomes 0, the value of FLG3 that is an output from the comparator 104a becomes 1. In this way, when the current command Iall*=0, the value of FLG3 becomes 1, or otherwise the value of FLG3 becomes 0. Furthermore, the value of FLG2 becomes 1 after the passage of the predetermined time t2 [sec] since the value of FLG3 becomes 1. The time t2 is 20 [sec], for example.

A second flag generation unit 22b shown in FIG. 6(b) is configured to include a comparator 104b that outputs 1 when the current command Iall* is 0, an OR gate 106 that outputs any one of an output from the comparator 104b and the gate block GB from the charge/discharge circuit (not shown) as the FLG3, and an ON delay unit 105b that changes the value of the FLG2 to 1 after the passage of the predetermined time t2 [sec] since the FLG3 becomes 1 (FLG3=1) and outputs the FLG2. By making such a configuration that a value of FLG2 is changed to 1 after passage of a predetermined time t2 [sec] from detection of the gate block GB from of the charge/discharge circuit, the value of the FLG2 can be changed with a higher accuracy than that of the second flag generation unit 22a shown in FIG. 6(a).

The value of the FLG2 indicates that the first estimated value SOC1 is computed in the first SOC computation unit 20 when FLG2=0, and that the second estimated value SOC20 is computed in the second SOC computation unit 24 when FLG2=1.

Each of the ON delay unit 105a shown in FIG. 6(a) and the ON delay unit 105b shown in FIG. 6(b) changes the value of the FLG2 with it being delayed only when the value of the FLG3 changes from 0 to 1, but changes the value of the FLG2 without it being delayed when the value of the FLG3 changes from 1 to 0. Accordingly, SOC estimation is halted for the period t2(s) for which the Vall suddenly changes after the charge or discharge.

Furthermore, because the second flag generation unit 22a shown in FIG. 6(a) or the second flag generation unit 22b shown in FIG. 6(b) obtains the FLG2 using the current command Iall*, the second flag generation unit 22a or 22b prevents the second SOC computation unit 24 from outputting the second estimated value SOC20 during the period (during the period t2, for example) during which the relation of |Iall|<Iallmin is satisfied but the charge or discharge continues due to constant voltage charge or discharge.

(Second SOC Computation Unit 24)

Figure 7:
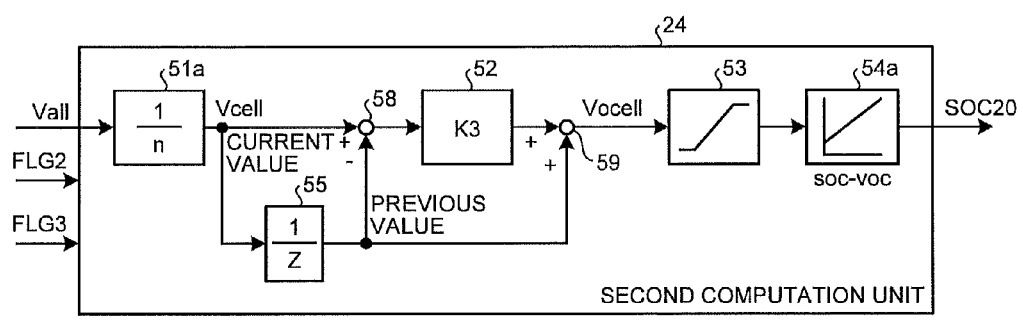
FIG. 7 is a diagram showing a configuration of a second SOC computation unit shown in FIG. 3.
Figure 8:
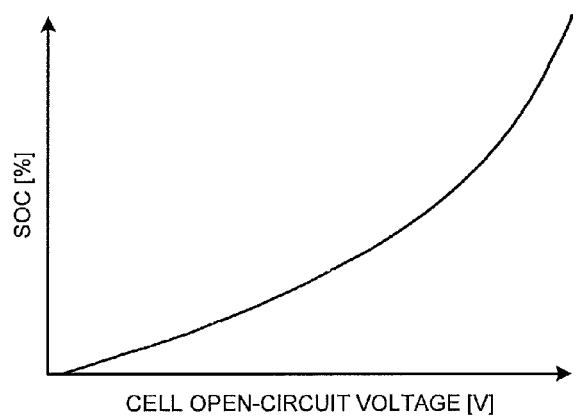
FIG. 8 is a chart showing a relation between a cell open-circuit voltage and an SOC.
Figure 9:
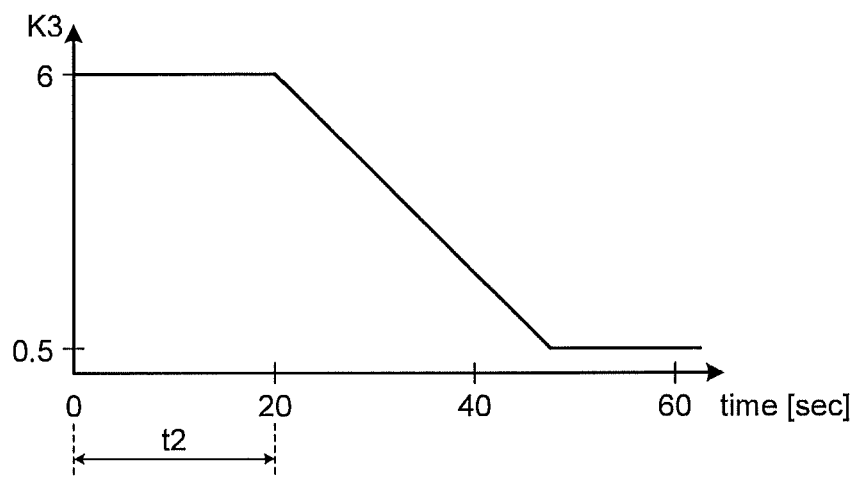
FIG. 9 is a chart showing one example of a gain K3 shown in FIG. 7.

FIG. 7 is a diagram showing a configuration of the second SOC computation unit 24 shown in FIG. 3, FIG. 8 is a chart showing a relation between the cell open-circuit voltage and the SOC, and FIG. 9 is a chart showing one example of a gain K3 shown in FIG. 7.

The second SOC computation unit 24 shown in FIG. 7 is configured to include, as main constituent elements, a gain unit 51a, a gain unit 52, a limiter 53, a table 54a, a unit-delay unit 55, a subtracter 58, and an adder 59.

The second SOC computation unit 24 operates when the FLG3 shown in FIG. 6 is 1, and has a computation cycle of t3 [sec]. For example, the time t3 is 5 [sec], that is, for example, 50 times as long as the overall computation cycle of the state-of-charge estimation apparatus 10.

The gain unit 51a obtains a cell voltage average value Vcell by multiplying the total voltage Vall by a gain 1/n. That is, the gain unit 51a obtains an average voltage value of cells by dividing the total voltage Vall by the number n of series-connected cell batteries.

The unit-delay unit 55 outputs the cell voltage average value Vcell from the gain unit 51a with it being delayed by one sample (t3). That is, the unit-delay unit 55 outputs a previous value of the cell voltage average value Vcell.

The subtracter 58 outputs a difference between the output (the previous value) from the unit-delay unit 55 and the output (a present value) from the gain unit 51a. The gain unit 52 multiplies the difference from the subtracter 58 by the gain K3 and outputs the multiplication result. The adder 59 adds the output (the previous value) from the unit-delay unit 55 to the output from the gain unit 52, thereby obtaining an open-circuit voltage estimated value (an open-circuit voltage) Vocell.

After passage of a sufficient time from the charge or discharge, Vocell=Vcell. However, right after the charge, Vocell<Vcell, and a difference between the Vocell and the Vcell then gradually decreases. Furthermore, right after the discharge, Vocell>Vcell, and the difference therebetween then gradually decreases. Therefore, the second SOC computation unit 24 obtains the open-circuit voltage estimated value Vocell at a present time (k) using the following Equation.

$$Vocell(k)=Vcell(k-1)+K3\times(Vcell(k)-Vcell(k-1))  \quad (1)$$

That is, multiplication of a change in the cell voltage average value Vcell from k−1 to k by K3 is added to the cell voltage average value Vcell(k−1) t3 before then. Accordingly, when the gain K3=1, the open-circuit voltage estimated value Vocell is equal to the present cell voltage average value Vcell, and when the gain K3<1, the influence of the change in the cell voltage average value Vcell on the open-circuit voltage estimated value Vocell decreases. Herein, the gain K3 is a variable gain.

The limiter 53 limits a value of the open-circuit voltage estimated value Vocell from the adder 59 to a practical value for reference to a table 54a.

In the table 54a, the open-circuit voltage estimated value Vocell is caused to correspond to the SOC as shown in FIG. 8. The correspondence between the open-circuit voltage estimated value Vocell and the SOC can be obtained by a charge/discharge test on the battery cell. The second SOC computation unit 24 outputs, as the second estimated value SOC20, the value of the SOC corresponding to the open-circuit voltage estimated value Vocell limited by the limiter 53 while referring to the table 54a. An approximate expression may be used in place of the table 54a.

The value of the gain K3 set for the gain unit 52 is set to be smaller with the passage of time and to become smaller than 1 as a final value as shown in FIG. 9. FIG. 9 shows the value of the gain K3 in the case where t2 is 20 [sec] and t3=5 [sec], as one example. The time when the second SOC computation unit 24 that has detected FLG3=1 starts operating is set as 0 [sec]. When the second SOC computation unit 24 performs computation at an interval of t3, for example, the value of the gain K3 during the period t2 (0 to 20 [sec]) is about 6.

The reason for setting the value of the gain K3 as described above is as follows. A state where the power storage device 11 is caused to suspend its discharge when being discharged is described by way of example.

Around the period t2, which is just after the end of the discharge, the difference between Vcell(k−1) and Vcell(k)−Vcell(k−1) is large. When the value of the gain K3 is small around the period t2, a change in the open-circuit voltage estimated value Vocell is large and the second estimated value SOC20 greatly changes accordingly. Until just before the end of the discharge, the SOC is estimated by the current integration. However, around the period t2 just after the end of the discharge, the total voltage Vall rapidly recovers (rises). With a view to estimate the stable SOC while suppressing the change in the second estimated value SOC20, the second SOC computation unit 24 according to the present embodiment sets the value of the gain K3 to be large around the period t2 just after the end of the discharge, thereby preventing the excess of the SOC. The excess of the SOC means that the SOC estimated value by the estimation of the open-circuit voltage right after the end of the discharge falls below the SOC estimated value by the current integration just after the end of the discharge.

The value of the gain K3 is set to gradually decrease after the passage of the period t2 and to be equal to 0.5 with the passage of about 50 [sec]. The reason for setting the value of the gain K3 as described above is as follows. The change in the cell voltage average value Vcell is originally supposed to be small because of the passage of a certain time after the end of the discharge. However, even when the discharge is suspended, the cell voltage average value Vcell fluctuates because the power conversion device 12 continues switching and the current detector 17, therefore, detects some ripple current or the voltage detector 18 has the voltage detection error. When the open-circuit voltage estimated value Vocell changes along with this change, the second estimated value SOC20 changes accordingly. To suppress such a change in the second estimated value SOC20, the second SOC computation unit 24 according to the present embodiment gradually decreases the value of the gain K3 after the passage of the period t2 and sets the gain K3 to K3=0.5 after the passage of about 50 [sec], thereby suppressing the change in the open-circuit voltage estimated value Vocell.

The gain K3 during the charge is also set to a value that decreases with the passage of time similarly to that during the discharge. For example, the value of the gain K3 is set to be large around the period t2 and to gradually decrease after the passage of the period t2. This is because an absolute value of a change rate of the voltage average value Vcell is large to small both after the discharge and after the charge although the magnitude relation between the open-circuit voltage estimated value Vocell and the voltage average value Vcell after the discharge is opposite to that after the charge.

(SOC Sudden-Change Prevention Unit 25)

Figure 10:
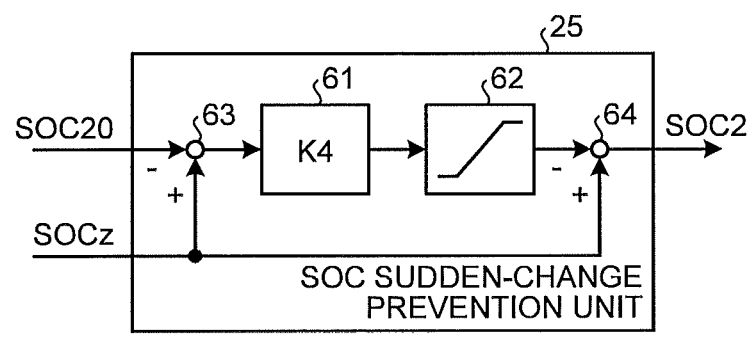
FIG. 10 is a diagram showing a configuration of an SOC sudden-change prevention unit shown in FIG. 3.

FIG. 10 is a diagram showing a configuration of the sudden-change prevention unit 25 shown in FIG. 3. The sudden-change prevention unit 25 is configured to include, as main constituent elements, a subtracter 63, a gain unit 61, a limiter 62, and a subtracter 64.

The subtracter 63 outputs a difference between the previous value SOCz and the second estimated value SOC20. The gain unit 61 multiplies the difference from the subtracter 63 by K4, and the limiter 62 limits an output from the gain unit 61 to ±0.02 [%] per 0.1 [sec] and outputs the limited result.

The subtracter 64 adds an output from the limiter 62 to the previous value SOCz and outputs an addition result as the third estimated value SOC2.

The above processing is specifically explained. First, the third estimated value SOC2 [%] is computed by the following Equation.

Third estimated value $SOC2 [\%] = SOCz - \text{Limit}(K4 (SOCz - SOC20))$ (2)

where the value of K4 is 0.8, for example, and for the limiter 62, ±0.02 [%] is set, for example.

Because the computation cycle of the sudden-change prevention unit 25 is 0.1 [sec], the third estimated value SOC2 changes at a maximum by 0.02 [%] for 0.1 [sec]. Furthermore, the computation cycle t3 of the second SOC computation unit 24 shown in FIG. 7 is 5 [sec]. Therefore, the second estimated value SOC20 from the second SOC computation unit 24 is updated once every 50 times of executions of computations of the sudden-change prevention unit 25. That is, the second estimated value SOC20 changes at a maximum by 0.02×50=1 [%] per 5 [sec]. As a specific example, when the second estimated value SOC20 inputted to the sudden-change prevention unit 25 decreases from 50%, for example, the second estimated value SOC20 becomes 49.98[%] 0.1 [sec] later and becomes 49.96 [%] further 0.1 [sec] later. That is, the second estimated value SOC20 5 [sec] after being inputted to the sudden-change prevention unit 25 decreases by 1 [%] to 49.0 [%]. Similarly, when a value of the second estimated value SOC20 increases from 50%, the second estimated value SOC20 becomes 51.0 [%] 5 [sec] later.

In this way, the sudden-change prevention unit 25 prevents the third estimated value SOC2 from suddenly changing by limiting the change in the second estimated value SOC20 from the second SOC computation unit 24 to 1% for 5 seconds. When the sudden-change prevention unit 25 does not have the limiter (Limit) 62, the sudden-change prevention unit 25 outputs a K4 multiple of the difference between the second estimated value SOC20 and the previous value SOCz as the third estimated value SOC2. For example, when K4=1, the difference between the second estimated value SOC20 and the previous value SOCz is directly reflected in the third estimated value SO2. Furthermore, the above-mentioned value of K4 and a set value of the limiter 62 are given as an example and the invention is not limited to these values.

Figure 11:
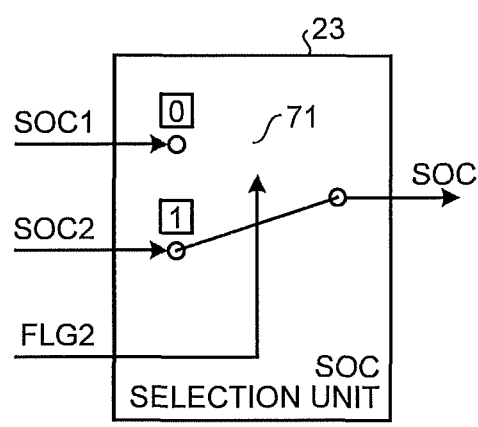
FIG. 11 is a diagram showing a configuration of an SOC selection unit shown in FIG. 3.

FIG. 11 is a diagram showing a configuration of the SOC selection unit shown in FIG. 3. The SOC selection unit 23 selects any one of the first estimated value SOC1 estimated by the first SOC computation unit 20 and the third estimated value SOC2 that is estimated by the second SOC computation unit 24 and has the sudden change limited by the sudden-change prevention unit 25 by a switch 71 that operates according to the value of the FLG2, and outputs the selected value as SOC that is the final SOC estimated value. For example, the first estimated value SOC1 is selected when the FLG2=0, and the third estimated value SOC2 is selected when the FLG2=1.

Specifically, the FLG2=0 is held during the charge and discharge and for the period (t2) of the passage of about 20 seconds from the charge or discharge is suspended. Therefore, the switch 71 selects the first estimated value SOC1 from the first SOC computation unit 20 and outputs the first estimated value SOC1. That is, when |Iall|<Iallmin, the current integration is halted in the first SOC computation unit 20, so that the SOC1 inputted to the SOC selection unit 23 is constant. Accordingly, the SOC is not updated during the charge or discharge and for the period t2 after the charge or discharge.

On the other hand, during a period until the charge or discharge is resumed after the passage of the period t2, the third estimated value SOC2 is selected.

When control power is activated, an appropriate SOC can not be obtained if an initial value of the unit-delay unit 26 that outputs the previous value SOCz is set to 0. Therefore, a method of setting the initial value is explained below.

Figure 12:
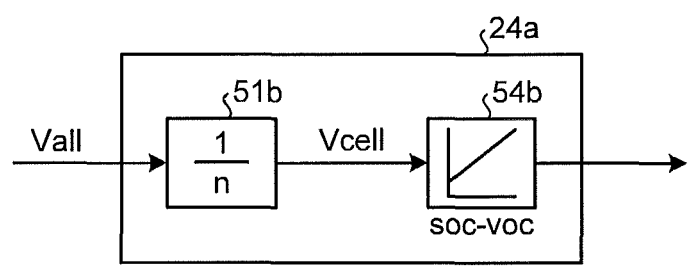
FIG. 12 is a diagram showing one example of a circuit that sets an initial value of a unit-delay unit shown in FIG. 3.

FIG. 12 is a diagram showing one example of a circuit that sets an initial value of the unit-delay unit shown in FIG. 3. An initial-value setting circuit 24a shown in FIG. 12 is configured to include a gain unit 51b and a table 54b. The gain unit 51b obtains the cell voltage average value Vcell by multiplying the total voltage Vall by the gain 1/n. In the table 54b, similarly to the table 54a shown in FIG. 7, the open-circuit voltage estimated value Vocell is caused to correspond to the SOC. The second SOC computation unit 24 outputs, as an initial value, a value of the SOC corresponding to the cell voltage average value Vcell while referring to the table 54b. An approximate expression may be used in place of the table 54b.

When a sufficient time passes since the previous charge or discharge, the open-circuit voltage of the power storage device 11 obtained from the voltage detector 18 can be considered to be constant, so that the initial-value setting circuit 24a can obtain the value (the initial value) of the SOC. For example, when a system starts after the end of the charge or discharge, the open-circuit voltage can be considered to be generally constant. Therefore, the first SOC computation unit 20 and the sudden-change prevention unit 25, shown in FIG. 3, perform computation of the first estimated value SOC1 and the second estimated value SOC20 using the initial value from the initial-value setting circuit 24a. When a sufficient time has not passed since the previous charge or discharge, the second SOC computation unit 24 shown in FIG. 7 updates the SOC to an appropriate SOC.

Note that a measured value of the total voltage Vall includes ripples and noise. Therefore, a configuration may be made such that the total voltage Vall is inputted to a lowpass filter of, for example, 100 Hz and then the SOC is estimated with an output from the filter being used as the total voltage Vall.

In a railway system, the total voltage Vall is about 600 V, and in the situation the number of series-connected cell batteries exceeds 160. On the other hand, according to the table 54a shown in FIG. 8, the relation between the open-circuit voltage and the SOC is that the value of SOC/open-circuit voltage increases as the open-circuit voltage and the SOC rise. Therefore, when the SOC is larger, the influence of a voltage change increases. When the open-circuit voltage changes by 10 mV (the total voltage is 1.6 V for the number of series-connected cell batteries is 160), for example, the SOC is considered to change by 2 to 3%. Therefore, it is difficult to keep the change in the SOC below a 1% level in consideration of resolution and measurement accuracy of the voltage detector 18. Furthermore, a DC-DC converter (not shown) that is included in the power conversion device 12 and executes the charge and discharge for the power storage device 11 is caused to operate with the current command being 0, it is thought that a voltage ripple resulting from a ripple current occurs. Under these conditions, it is necessary to provide an estimation method that allows the SOC estimated value to include a few errors and prevents the SOC estimated value from remarkably deviating from an actual SOC and from excessively changing under these conditions. Moreover, in the railway system, it is assumed to frequently use not only constant-current operation but also constant-voltage operation during the charge or discharge so as to improve battery utilization efficiency and to protect the batteries.

The state-of-charge estimation apparatus 10 according to the present embodiment can ensure a high estimation accuracy both during the charge/discharge and during suspension thereof by using a combination of SOC computation based on the current integration (the first SOC computation unit 20) and SOC computation based on the estimation of the open-circuit voltage (the second SOC computation unit 24).

Moreover, it is unnecessary to use a battery equivalent circuit model for the estimation of the open-circuit voltage, and it is possible to obtain a stable estimated value by the use of only the measured value of the total voltage Vall without any large deviation from the actual SOC and the excessive change in the estimated value. Furthermore, the state-of-charge estimation apparatus 10 can be less influenced by noise.

Further, even when the charge or discharge continues at a low current at which the influence of the error is larger in the case of estimation based on the current integration, the state-of-charge estimation apparatus 10 according to the present embodiment does not erroneously estimate the open-circuit voltage although the estimated value can not be updated but the charge or discharge continues. Therefore, the state-of-charge estimation apparatus 10 according to the present embodiment can handle not only the constant-current charge and discharge but also the constant-voltage charge and discharge.

As described above, the state-of-charge estimation apparatus 10 according to the present embodiment includes: the first SOC computation unit 20 that computes the current integration value of the total current Iall detected by the current detector 17 and computes the first estimated value SOC1 based on the current integration value while the previous value SOCz is set as the initial value; the second SOC computation unit 24 that computes, after the charge or discharge in the power storage device 11 is suspended, the open-circuit voltage estimated value Vocell based on the cell voltage average value Vcell of the total voltage Vall detected by the voltage detector 18, the previous value of the cell voltage average value Vcell, and the gain K3 that changes with the passage of time after the charge or discharge is suspended, and outputs the open-circuit voltage estimated value Vocell as the second estimated value SOC20; and the sudden-change prevention unit 25 that limits the change amount in the second estimated value SOC20 in the computation cycle t3 of the second SOC computation unit 24 to be equal to or smaller than the predetermined value (1%) based on the previous value SOCz and the second estimated value SOC20. Therefore, it is possible to improve the accuracy of estimating the SOC during the charge or discharge and during the suspension of the charge and discharge.

The second SOC computation unit 24 according to the present embodiment can compute the open-circuit voltage estimated value Vocell only based on the total voltage Vall. Therefore, it is possible to estimate the SOC from the open-circuit voltage estimated value Vocell without using any equivalent circuit model as in the conventional techniques.

The second SOC computation unit 24 according to the present embodiment computes the open-circuit voltage estimated value Vocell by the use of the gain unit 52. Therefore, it is possible to suppress the change in the open-circuit voltage estimated value Vocell after the end of the charge or discharge, and to obtain the stable SOC estimated value (the second estimated value SOC20).

The first SOC computation unit 20 according to the present embodiment controls the first estimated value SOC1 to be constant when FLG1=0. Therefore, it is possible to estimate the SOC even during the period (t2) during which the constant-voltage charge or discharge continues and the open-circuit voltage estimated value Vocell can not be estimated.

In the above descriptions, the cell batteries included in the power storage device 11 are arranged in n series-connected cell batteries by m parallel-connected cell batteries; however, needless to mention, the values of n and m can be also each set to an arbitrary value equal to or larger than 1. Furthermore, values of the computation cycles t1 to t3 described above are given only as examples and the computation cycles t1 to t3 are not limited to these values. Further, as one example, the value of the gain K3 shown in FIG. 9 is set to be constant during the period t2 (0 to 20 seconds) and then gradually decrease. Alternatively, similar effects can be attained even when the state-of-charge estimation apparatus 10 is configured to, for example, gradually change the value of the gain K3 from the time (0 second) when the charge or discharge ends.

Second Embodiment

Figure 13:
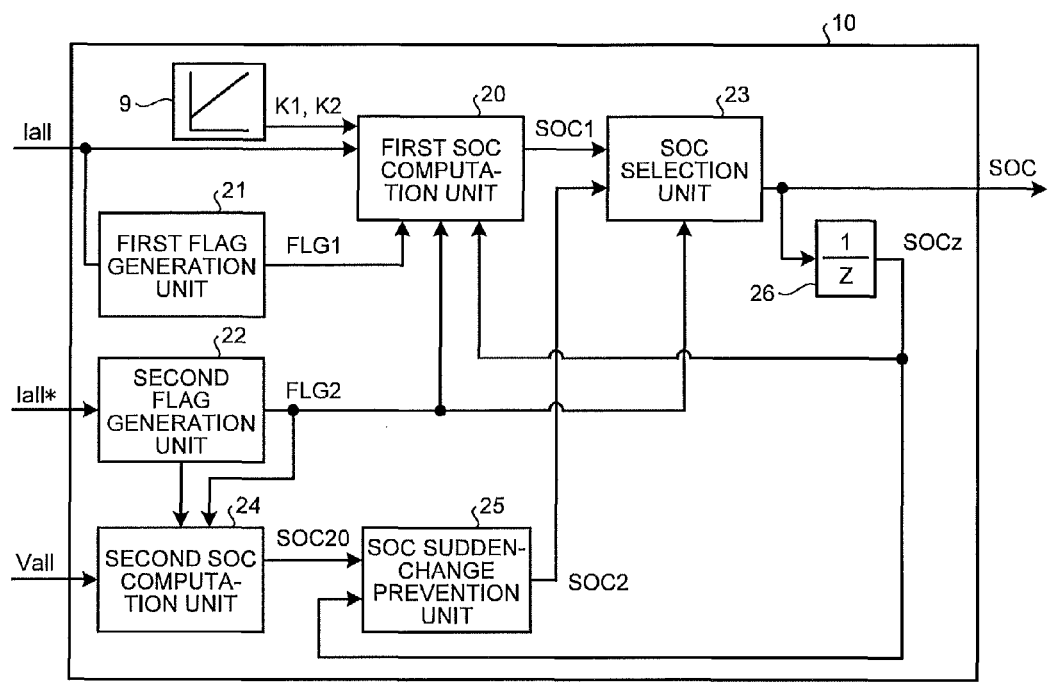
FIG. 13 is a diagram showing a configuration of a state-of-charge estimation apparatus according to a second embodiment of the present invention.

FIG. 13 is a diagram showing a configuration of the state-of-charge estimation apparatus 10 according to a second embodiment of the present invention. Elements identical to those in the first embodiment are denoted by the same reference signs and description thereof is omitted, only parts different from the first embodiment are described here. The state-of-charge estimation apparatus 10 according to the second embodiment differs from that shown in FIG. 3 in that a table 9 is provided. The secondary batteries applied to the power storage device 11 degrade with the passage of service time and decrease in capacity. It is significant to accurately ascertain the SOC of a secondary battery. For example, when the secondary batteries are overcharged because of inability to accurately ascertain the SOC of the secondary battery, long-time reliability such as a service life of the secondary battery may be damaged. To this end, it is necessary to accurately determine the SOC of the secondary batteries in use and execute charge/discharge control.

As described above, the gains (K1 and K2) for converting the current integration value from the integrator 43 into the first estimated value SOC1 are set for the first SOC computation unit 20. Specifically, the gain K1 is set for the gain unit 44 and obtained by K1=1/battery capacity [Ah])/3600 [sec]× 100 [%]. The gain K2 is set for the gain unit 45 and obtained by K2=1/battery capacity [Ah]×3600 [sec]/100 [%]. The gains K1 and K2 change according to the value of the battery capacity [Ah], and therefore an error occurs to the estimated SOC when the value of the battery capacity [Ah] differs from an actual battery capacity.

Therefore, the state-of-charge estimation apparatus 10 according to the present embodiment is configured to reduce an estimation error in the first estimated value SOC1 using the battery capacity [Ah] corrected according to the degradation degree of the power storage device 11, not using the gains K1 and K2 derived from a fixed value (a battery capacity) such as a battery nominal value.

In the table 9, the battery capacity obtained from a charge/discharge time integration value, a charge/discharge capacity integration value or the like, that is, the battery capacity corrected according to the reduction in the capacity of the power storage device 11 is caused to correspond to the gains K1 and K2 corresponding to this battery capacity. The first SOC computation unit 20 computes the first estimated value SOC1 by the use of the gains K1 and K2 corresponding to the corrected battery capacity while referring to the table 9.

As described above, the state-of-charge estimation apparatus 10 according to the present embodiment computes the first estimated value SOC1 by the use of the gains K1 and K2 corresponding to the corrected battery capacity. Therefore, it is possible to improve the accuracy of computing the SOC based on the current integration in addition to the advantageous effects of the state-of-charge estimation apparatus 10 according to the first embodiment.

Third Embodiment

Figure 14:
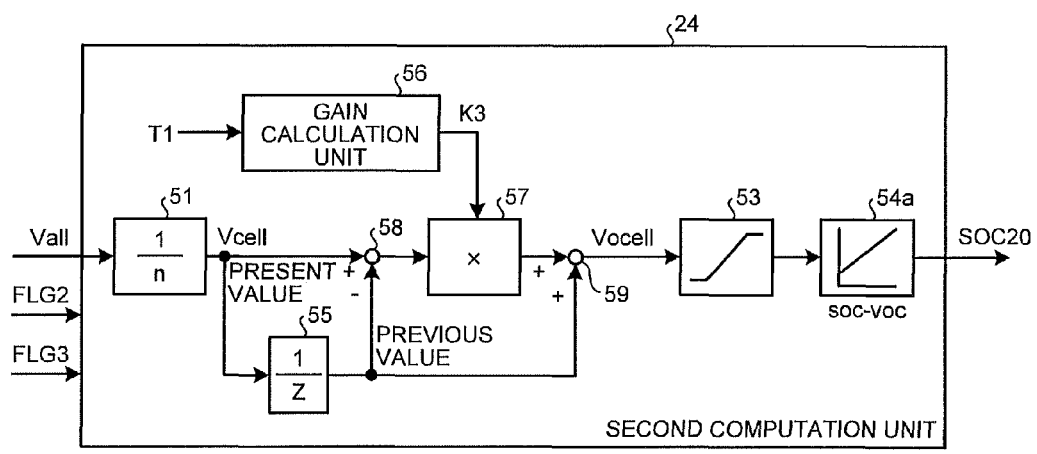
FIG. 14 is a diagram showing a configuration of a second SOC computation unit according to a third embodiment of the present invention.

FIG. 14 is a diagram showing a configuration of the second SOC computation unit 24 according to a third embodiment of the present invention. Elements identical to those in the first embodiment are denoted by the same reference signs and their description is omitted, and only parts different from the first embodiment are explained here. The same blocks as those in FIG. 7 are denoted by the same numbers as those in FIG. 7. This is different from the second SOC computation unit 24 in FIG. 7 in that it includes a gain calculation unit 56 and a multiplier 57.

The gain calculation unit 56 calculates the gain K3 that changes in dependence upon a module temperature (a battery temperature) T1 with the passage of time after the suspension of the charge or discharge in the power storage device 11. The module temperature T1 is a temperature of the battery modules obtained from the power storage device 11 shown in FIG. 1. The multiplier 57 multiplies the difference from the subtracter 58 by the gain K3 from the gain calculation unit 56. The adder 59 adds the output from the unit-delay unit 55 to an output from the multiplier 57, thereby obtaining the open-circuit voltage estimated value Vocell. In this way, the second SOC computation unit 24 according to the present embodiment multiplies the output from the subtracter 58 (the difference of the voltage average value Vcell) by the gain K3 from the gain calculation unit 56. It is thereby possible to improve the accuracy of estimating the open-circuit voltage estimated value Vocell even when voltage change characteristics of the power storage device 11 after the charge or discharge change in dependence upon the module temperature T1.

The module temperature T1 is not limited to the module temperature itself, and may be a temperature of another portion that reflects the battery temperature. Furthermore, the second SOC computation unit 24 according to the present embodiment may be combined with the first SOC computation unit 20 according to the second embodiment.

Moreover, information inputted to the gain calculation unit 56 so as to calculate the gain K3 is not limited to the module temperature T1. Information that changes according to the battery temperature, for example, a value such as current, voltage, or SOC can be used as the information.

As described above, the second SOC computation unit 24 according to the present embodiment computes the open-circuit voltage estimated value Vocell based on the module temperature T1 and the total voltage Vall. In this way, the second SOC computation unit 24 can compute the open-circuit voltage estimated value Vocell according to the change in the module temperature T1, so that it is possible to improve the accuracy of estimating the second estimated value SOC20 in addition to the effects of the second SOC computation unit 24 according to the first embodiment.

The state-of-charge estimation apparatus 10 described in the first or second embodiment is configured to select any one of the first estimated value SOC1 from the first SOC computation unit 20 and the third estimated value SOC2 from the SOC sudden-change prevention unit 25 according to the passage of time since the suspension of the charge or discharge of the power storage device 11. However, the invention is not limited thereto, and for example, the state-of-charge estimation apparatus 10 may be configured to exclude the sudden-change prevention unit 25 and directly input the second estimated value SOC20 from the second SOC computation unit 24 to the SOC selection unit 23. In this case, the SOC selection unit 23 selects any one of the first estimated value SOC1 and the second estimated value SOC20 in accordance with the value of the FLG2 from the second flag generation unit 22. Even in this configuration, the second SOC computation unit 24 can suppress the change in the open-circuit voltage estimated value Vocell after the passage of the period t2. Therefore, the change in the open-circuit voltage estimated value Vocell can be more suppressed as compared with the conventional techniques although the effect of preventing the sudden change in the second estimated value SOC20 as exhibited by the first and second embodiments may not be attained. Therefore, it is possible to improve the accuracy of estimating the second estimated value SOC20.

The first SOC computation unit 20 shown in the first or second embodiment is configured to compute the first estimated value SOC1 by causing the gain unit 41 to obtain the cell current average value Icell. Alternatively, the first estimated value SOC1 may be obtained by integrating the total current Iall without using the gain unit 41. Furthermore, the second SOC computation unit 24 described in the first and second embodiments is configured to compute the open-circuit voltage estimated value Vocell by causing the gain unit 51a to obtain the cell voltage average value Vcell. However, the invention is not limited thereto. For example, the open-circuit voltage may be estimated by, without using the gain unit 51a, multiplying the difference between the total voltage Vall and the previous value of the total voltage Vall by the gain, and by adding the output from the gain unit 52 to the previous value of the total voltage Vall.

The state-of-charge estimation apparatus described in the first to third embodiments are only an example of the present invention, and it is needless to mention that the state-of-charge estimation apparatus can be combined with other well-known techniques, or can be configured with being modified, such as with omitting a part thereof, without departing from the spirit of the present invention.

Industrial Applicability

As described above, the present invention can be applied to apparatuses that estimate an SOC of a secondary battery, and is particularly useful as an invention that can suppress a change in an SOC estimated value even when the battery-voltage measurement accuracy is low and/or even when a measured voltage has certain ripples.

Reference Signs List 21-1, 2n-1, 21-m, 2n-m BATTERY MODULE
4-1, 4-k, 5-1, 5-k, 6-1, 6-k, 7-1, 7-k CELL BATTERY
9, 54a, 54b TABLE
10 STATE-OF-CHARGE ESTIMATION APPARATUS
11 POWER STORAGE DEVICE
12 POWER CONVERSION DEVICE
13 OVERHEAD WIRE
14 POWER COLLECTOR
15 WHEEL
17 CURRENT DETECTOR
18 VOLTAGE DETECTOR
20 FIRST SOC COMPUTATION UNIT
21, 21a, 21b FIRST FLAG GENERATION UNIT
22, 22a, 22b SECOND FLAG GENERATION UNIT
23 SOC SELECTION UNIT
24 SECOND SOC COMPUTATION UNIT
24a INITIAL-VALUE SETTING CIRCUIT
25 SOC SUDDEN-CHANGE PREVENTION UNIT (CHANGE-AMOUNT RESTRICTION UNIT)

26, 55 UNIT-DELAY UNIT
41, 44, 45, 51, 51a, 51b, 52, 61 GAIN UNIT
42, 57 MULTIPLIER
43 INTEGRATOR
53, 62 LIMITER
56 GAIN CALCULATION UNIT
58, 63, 64 SUBTRACTER
59 ADDER
71 SWITCH
101a, 101b ABSOLUTE-VALUE COMPUTATION UNIT
102a, 102b, 104a, 104b COMPARATOR
103 NOR GATE
105a, 105b ON DELAY UNIT
106 OR GATE
FLG1 FIRST FLAG
FLG2 SECOND FLAG
FLG3 THIRD FLAG
GB GATE BLOCK
Iall TOTAL CURRENT
Iall* CURRENT COMMAND
Icell CELL CURRENT AVERAGE VALUE
Iallmin CURRENT THRESHOLD
K1, K2, K3 GAIN
SOC1 FIRST STATE-OF-CHARGE ESTIMATED VALUE
SOC20 SECOND STATE-OF-CHARGE ESTIMATED VALUE
SOC2 THIRD STATE-OF-CHARGE ESTIMATED VALUE
SOCz PREVIOUS STATE-OF-CHARGE VALUE
T1 MODULE TEMPERATURE
t1 COMPUTATION CYCLE OF ENTIRE POWER STORAGE DEVICE
t2 PERIOD FOR WHICH Vall SUDDENLY CHANGES AFTER CHARGE OR DISCHARGE
t3 COMPUTATION CYCLE OF SECOND SOC COMPUTATION UNIT
Vall TOTAL VOLTAGE
Vcell CELL VOLTAGE AVERAGE VALUE (VOLTAGE AVERAGE VALUE)
Vocell OPEN-CIRCUIT VOLTAGE ESTIMATED VALUE (OPEN-CIRCUIT VOLTAGE)

The invention claimed is:

1. A state-of-charge estimation apparatus that is connected to a power storage device constituted by connecting a plurality of cell batteries, and estimates a state of charge of the power storage device, the state-of-charge estimation apparatus comprising:
    a first computation unit that computes a current integration value based on a current from a detector that detects a current flowing to or from the power storage device from or to a power conversion unit while a previous value of a state-of-charge estimated value is set as an initial value, and that outputs the computed current integration value as a first state-of-charge estimated value;
    a second computation unit that includes a gain unit that gives a predetermined gain to a difference between a voltage detected in a connection point between the power conversion unit and the power storage device and a previous value of the voltage detected in the connection point, estimates an open-circuit voltage based on an output from the gain unit and the previous value of the voltage detected in the connection point, and outputs the open-circuit voltage as a second state-of-charge estimated value; and
    a selection unit that selects any one of the first state-of-charge estimated value and the second state-of-charge estimated value, wherein
    the predetermined gain is set to be a large value during a predetermined period in which the voltage suddenly changes after suspension of charge or discharge in the power storage device, and to decrease to be a final value that is smaller than 1 after passage of the predetermined period, and
    the second computation unit estimates the open-circuit voltage using the predetermined gain when a current command outputted from the power conversion unit indicates suspension of the charge or discharge in the power storage device.

2. The state-of-charge estimation apparatus according to claim 1, wherein the second computation unit estimates the open-circuit voltage by multiplying a difference between an average value of the voltage and a previous value of the voltage by the predetermined gain, and by adding the previous value of the voltage to a multiplication result.

3. The state-of-charge estimation apparatus according to claim 1, wherein the second computation unit estimates an open-circuit voltage of the cell batteries by obtaining a cell battery voltage average value of a voltage detected in a connection point between the power conversion unit and the power storage device, multiplying a difference between the cell battery voltage average value and a previous value of the cell battery voltage average value by the predetermined gain, and adding the previous value of the cell battery voltage average value to a multiplication result.

4. The state-of-charge estimation apparatus according to claim 1, comprising a table that stores a battery capacity corrected according to reduction in a capacity of the power storage device and a gain for converting the current integration value into the first state-of-charge estimated value with correspondence relations to each other, wherein
    the first computation unit computes the first state-of-charge estimated value corresponding to the battery capacity while referring to the table.

5. The state-of-charge estimation apparatus according to claim 1, comprising a gain calculation unit that calculates a gain that decreases with passage of time after suspension of charge or discharge in the power storage device and changes in dependence upon a battery temperature, wherein
    the second computation unit computes the open-circuit voltage based on the voltage, a previous value of the voltage, and the gain from the gain calculation unit.

6. A state-of-charge estimation apparatus that is connected to a power storage device constituted by connecting a plurality of cell batteries, and estimates a state of charge of the power storage device, the state-of-charge estimation apparatus comprising:
    a first computation unit that computes a current integration value based on a current from a detector that detects a current flowing to or from the power storage device from or to a power conversion unit while a previous value of a state-of-charge estimated value is set as an initial value, and that outputs the computed current integration value as a first state-of-charge estimated value;
    a second computation unit that includes a gain unit that gives a predetermined gain to a difference between a voltage detected in a connection point between the power conversion unit and the power storage device and a previous value of the voltage detected in the connection point, estimates an open-circuit voltage based on an output from the gain unit and the previous value of the voltage detected in the connection point, and outputs the open-circuit voltage as a second state-of-charge estimated value;

a change-amount limitation unit that limits a change amount of the second state-of-charge estimated value in a computation cycle of the second computation unit to be equal to or smaller than a predetermined value based on the previous value of the state-of-charge estimated value and the second state-of-charge estimated value from the second computation unit; and a selection unit that selects any one of the first state-of-charge estimated value and an output from the change-amount limitation unit, wherein the predetermined gain is set to be a large value during a predetermined period in which the voltage suddenly changes after suspension of charge or discharge in the power storage device, and to decrease to be a final value that is smaller than 1 after passage of the predetermined period, and the second computation unit estimates the open-circuit voltage using the predetermined gain when a current command outputted from the power conversion unit indicates suspension of the charge or discharge in the power storage device.

7. The state-of-charge estimation apparatus according to claim 6, wherein the second computation unit estimates the open-circuit voltage by multiplying a difference between an average value of the voltage and a previous value of the voltage by the predetermined gain, and by adding the previous value of the voltage to a multiplication result.

8. The state-of-charge estimation apparatus according to claim 6, wherein the second computation unit estimates an open-circuit voltage of the cell batteries by obtaining a cell battery voltage average value of a voltage detected in a connection point between the power conversion unit and the power storage device, multiplying a difference between the cell battery voltage average value and a previous value of the cell battery voltage average value by the predetermined gain, and adding the previous value of the cell battery voltage average value to a multiplication result.

9. The state-of-charge estimation apparatus according to claim 6, comprising a table that stores a battery capacity corrected according to reduction in a capacity of the power storage device and a gain for converting the current integration value into the first state-of-charge estimated value with correspondence relations to each other, wherein the first computation unit computes the first state-of-charge estimated value corresponding to the battery capacity while referring to the table.

10. The state-of-charge estimation apparatus according to claim 6, comprising a gain calculation unit that calculates a gain that decreases with passage of time after suspension of charge or discharge in the power storage device and changes in dependence upon a battery temperature, wherein the second computation unit computes the open-circuit voltage based on the voltage, a previous value of the voltage, and the gain from the gain calculation unit.

* * * * *